United States Patent
Douziech et al.

(10) Patent No.: US 6,781,474 B2
(45) Date of Patent: Aug. 24, 2004

(54) APPARATUS AND METHOD FOR TUNING A FILTER

(75) Inventors: Patrick Douziech, Cessy (FR); John Avis Shepherd, Blahnac (GB)

(73) Assignee: Freescale Semiconductor, Inc., Austin, TX (US)

( * ) Notice: Subject to any disclaimer, the term of this patent is extended or adjusted under 35 U.S.C. 154(b) by 39 days.

(21) Appl. No.: 10/351,824

(22) Filed: Jan. 27, 2003

(65) Prior Publication Data

US 2003/0155988 A1 Aug. 21, 2003

(30) Foreign Application Priority Data

Feb. 18, 2002  (EP) .............................................. 02290380

(51) Int. Cl.[7] .......................... H04B 3/04; H03G 11/00; H03H 19/00
(52) U.S. Cl. ...................... 333/17.1; 333/174; 333/17.2
(58) Field of Search .............................. 333/17.1, 17.2, 333/174, 205, 207, 209

(56) References Cited

U.S. PATENT DOCUMENTS 4,053,933 A * 10/1977 Collins ....................... 348/733
4,272,743 A * 6/1981 Evans ......................... 333/176
4,736,456 A * 4/1988 Maier ....................... 455/164.2
5,072,298 A * 12/1991 Sumiyoshi ................... 348/711

FOREIGN PATENT DOCUMENTS

WO    WO 86/05637    * 9/1986

\* cited by examiner

*Primary Examiner*—Barbara Summons
(74) *Attorney, Agent, or Firm*—Robert L. King

(57) ABSTRACT

An apparatus and method for tuning a filter (11) with oscillator alignment for applications where the filter tuning signal (19, 27) is generated independently of the local oscillator tuning signal and the tuning range is large, for example such as terrestrial and cable TV broadcasting (40 to 860 MHz). The filter being adapted to a filter tuning modulation signal (25) having a first frequency (F1) and a second frequency (F2). Values of the output signal (28) are measured, a first value (S1) at the first frequency, and a second value (S2) at the second frequency, and a comparison signal (26) is generated in comparing the first value and the second value to adjust filter with the tuning control signal in response to the comparison signal, modulation signal and an approximate filter tuning signal to provide a desired signal at the output signal.

10 Claims, 3 Drawing Sheets

US 6,781,474 B2

APPARATUS AND METHOD FOR TUNING A FILTER

FIELD OF THE INVENTION

The present invention relates generally to an apparatus and method for tuning oscillator and filter alignment. More specifically, the invention relates to an apparatus and method tracking the high frequency filters and local oscillator, used for example in TV tuners, and similar systems working over a wide frequency range such as terrestrial and cable TV broadcasting (40 to 860 MHz), satellite TV first IF (950 to 2400 MHz), shortwave receivers (2 to 30 MHz), FM broadcast receivers (88 to 108 MHz, etc.

BACKGROUND OF THE INVENTION

Typical TV tuner architectures usually consist of a variable gain pre-amplifier stage with a single tuned resonant circuit at the input. The variable pre-amplifier stage is typically a dual-gate MOSFET. The output of the variable gain pre-amplifier stage is connected to a mixer stage via a tuned bandpass filter, which may comprise of two coupled parallel LC circuits. The mixer is also driven by a signal derived from a local oscillator with a frequency that is determined by a tuneable resonant circuit. The tuning of the filters and the local oscillator is usually achieved by variable capacitance diodes such that the same control voltage is applied to all of the variable capacitance diodes generated by a phase-locked-loop arrangement. The role of the filters is to reduce the level of unwanted signals to avoid overloading of the receiver and in particular any signal falling within the image frequency response created by the mixing of the input signals to an intermediate frequency. The rejection of the image frequency response is of considerable importance when the intermediate frequency is low and the image frequency falls with the band to be covered by the system. In order to cover the entire frequency range, for example to 860 MHz in terrestrial and cable TV broadcasting, the range is typically divided by two or three bands, with each band covering one or more octaves. Each band then usually requires an input filter, gain controlled amplifier, bandpass filter, mixer and local oscillator, where the mixers, local oscillators and phase-locked-loop circuit are usually combined in one or more integrated circuits.

Another means of covering the wide frequency range consists in mixing the incoming signals to create an image frequency outside the band to be received. It is then possible to reject the image frequency response with no-tuneable lowpass or highpass filters. However, this method does not protect the receiver from strong unwanted signals within the band to be received. A tuneable filter at the input is often required to this end. With these typical configurations, tracking over the desired band is achieved by the use of matched variable capacitance diodes and by factory adjustment of the coils on a few carefully chosen channels, for example low end, high end, and centre of band.

However, with these approaches errors can occur on channels between the adjustment points, often reaching a maximum midway between them. One method to compensate for this and to reduce any degradation of performance due to mis-tracking, is to design the filters with a passband wider than required, so that any tuning errors will cause a negligible degradation of the received signal. Associated errors in tracking caused by drift with temperature have been minimised with careful design by using matched variable capacitance diodes. In order to reduce the number of external components, there is a need to integrate all the frequency determining components of the local oscillator. However, it is difficult to achieve this by using the same tuning voltage for the filters and the local oscillator fully integrated within an integrated circuit, since the characteristic of the local oscillator tuning voltage will then be different to that of the filters. If the tuning characteristics are known and stable, it is possible to generate the tuning voltage by any known analogue or digital means. However, it is difficult to compensate for different temperatures with mechanical and electrical design when the local oscillator is completely integrated. For example, in U.S. Pat. No. 4,736,456 a predetermined voltage is added to the local oscillator tuning voltage to obtain a filter tuning voltage, however, as the frequency determining elements of the local oscillator are within an integrated circuit, variation of frequency with temperature of the local oscillator will differ from that of the filters. Furthermore, the frequency determining elements of the filters will undergo mechanical and electrical stresses which are largely different from those within the integrated circuit, causing ageing.

Thus, there is a need for an apparatus and method for tuning the frequency of the local oscillator and of the filters for applications where filter tuning signal is generated independently of the local oscillator tuning signal in a wide tuning range, particularly when some of elements are completely integrated within an integrated circuit.

SUMMARY OF THE INVENTION

An apparatus and method are provided for tuning a filter for applications where the filter tuning signal is generated independently of the local oscillator tuning signal and the tuning range is large. The filter receives an input signal and provides an output signal. The filter is adapted to receive a tuning control signal to adjust the filter to provide the output signal to a desired signal. The tuning control signal results from a modulation signal, a correction signal and an approximate filter tuning signal generated by a filter tuning signal generator. The modulation signal has a frequency that varies between a first frequency and a second frequency, a first value of the output signal measured at the first frequency, and a second value of the output signal measured at the second frequency. A comparator compares the first value and the second value and provides the correction signal to adjust the filter with the tuning control signal with respect frequency and the second frequency of the modulation signal, the correction signal and the approximate filter tuning signal.

BRIEF DESCRIPTION OF THE DRAWINGS

Embodiments of the invention will now be more fully described, by example, with reference to the drawings, of which.

DESCRIPTION OF THE PREFERRED EMBODIMENTS

Figure 1:
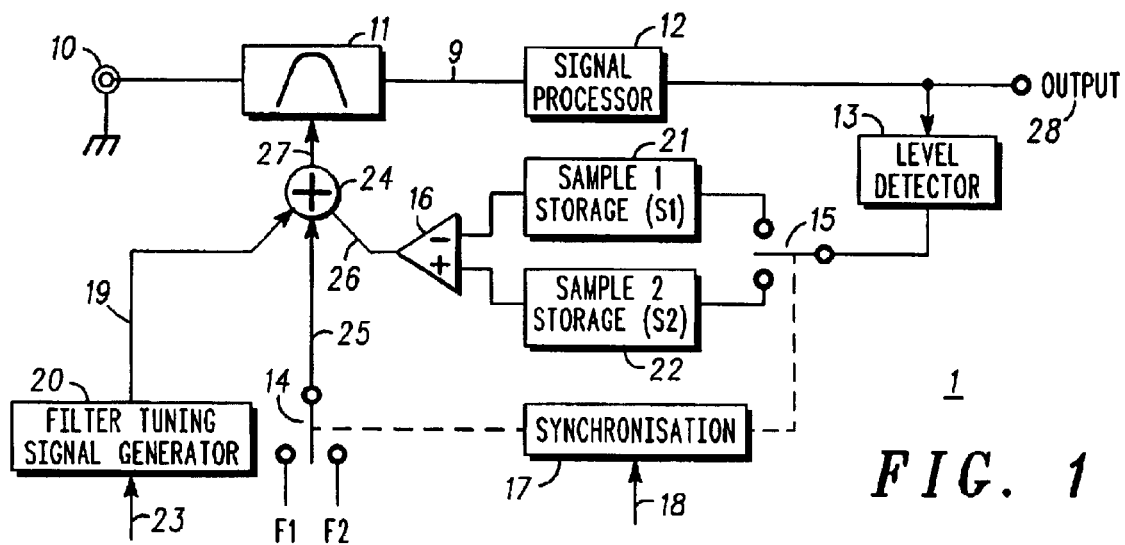
FIG. 1 shows a block diagram of an apparatus for centring a tuneable filter around a desired signal according to an embodiment of the invention.

Referring to FIG. 1 a block diagram is shown of an apparatus 1 for centring a tuneable filter around a desired signal according to an embodiment of the invention. In this embodiment a RF input signal 10 is received at signal processor 12 via filter 11. The signal from the signal processor is feedback through level detection 13 and switch 15. The feedback signal is passed to sample storage (S1) 21 or sample storage (S2) 22 and onto negative or positive inputs, respectively, of comparator 16 to provide a filter tuning correction signal 26. The filter tuning correction signal 26 is received at summing terminal 24 together with an approximate filter tuning signal 19 generated by a filter tuning signal generator 20 that may be controlled by control signal 23. The switch 15, and a switch 14 between two signals corresponding to two frequencies F1, F2 that provide a filter tuning modulation signal 25 that is also received at the summing terminal, are synchronised by timing generator 17 and external synchronisation signal 18. A filter tuning control signal 27 is received at filter 11 from the summing terminal 24, which alters the RF input signal and resulting output signal 28.

In operation, the centre of filter 11 is shifted periodically between two frequencies F1, F2 by filter tuning modulation signal. The frequencies F1 and F2 are chosen to obtain a variation of the signal applied to the level detector 13 which allows comparator 16 to provide a reliable correction signal to filter 11 via the summing terminal 24. The values of F1 and F2 will depend largely on the frequency response of filter 11. For example, with a single pole filter having a half-power bandwidth of 10 MHz, the difference in frequency between F1 and F2 may be about 2 MHz. The signals applied to switch 14 are chosen accordingly. At each frequency the amplitude of the signal at the output of the filter is measured and stored S1, S2 respectively. It will be appreciated that the filter can cause other characteristics (other than signal amplitude) of the signal to vary, i.e. depending on the type of signal being processed. These other signal characteristics can also be measured, as long as the characteristic reaches a maximum at the centre frequency of the filter. To apply this embodiment, however, the implementation is usually more difficult than the simple measurement of amplitude. Additionally, It will be appreciated that the measurement does not have to be taken at the output of the system, but, for example, the amplitude of the signal must depend on the tuning of the filter. The two stored values S1, S2 are then compared. Depending on the comparison of S1, S2, then the filter is retuned accordingly, which is shown in the graphs of FIGS. 2a–d.

Figure 2A:
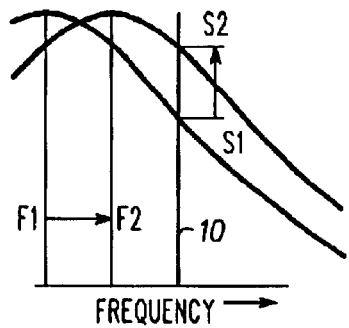
FIGS. 2a, 2b, 2c and 2d show graphs of filter offset conditions for the apparatus shown in FIG. 1 according to an embodiment of the invention.
Figure 2B:
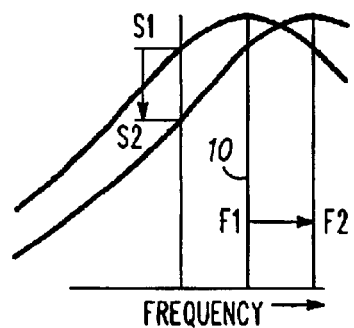
Figure 2C:
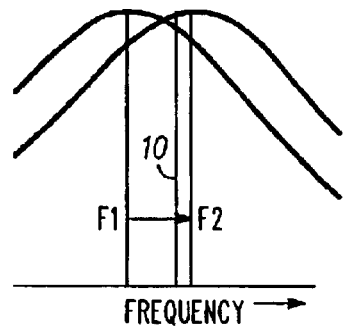
Figure 2D:
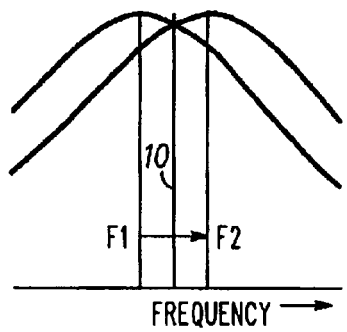

In each of the graphs shown in FIGS. 2a–d, the amplitudes of the signals passed through the filter, i.e. RF input signal 10 and filter tuning signal 27, with the filter centre at different frequencies with respect to the frequencies of the input signal 10. In FIG. 2a, the two filter centre frequencies F1, F2, that contribute to the filter tuning signal 27, are below that of the input signal 10. As the frequency of the filter changes from F1 to F2, the amplitude of the output signal 28 increases. The value stored at S2 is greater than that at S1. The filter tuning signal 27 must be varied to increase the centre frequency of filter 11 thereby bringing it closer to the frequency of the RF input signal 10. FIG. 2b shows the case where the centre frequency of the filter 11 is always higher than that of the input signal 10. For example, S2 is smaller than S1, and the result of the comparison is inverted with respect to that of FIG. 2a, and it will tend to lower the frequency of the filter. In FIG. 2c, the filter centre frequency is below the input signal frequency F1, but above it at F2. As the frequency of RF input signal 10 is higher than the frequency midway between F1 and F2, S2 is greater than S1, which causes the filter frequency to be increased. It can be appreciated that when the frequency of RF input signal 10 is lower than the frequency midway between F1 and F2, S2 will be lower than S1, which causes the filter frequency to be decreased. When the values at S1, S2 are identical, the filter tuning is unchanged, as shown in FIG. 2d. Thus, it can be appreciated that the error signal output from the comparator will tend to centre the filter on the received signal.

Referring back to FIG. 1, the signal 9 at the output of the filter undergoes some form of processing, such as amplification, frequency conversion, or the like, before being applied to the level detector 13. A signal processor 12 may perform this processing. In order to position the filter near the desired frequency, an approximate tuning voltage 19 is applied to the filter 11. For this embodiment, it is assumed that increasing the tuning voltage applied to the filter increases the centre frequency of the filter 11. The switch 14 applies a signal to the filter tuning input in order to position the centre at frequency F1. The switch 15 feeds the signal from the output of the level detector to first sample storage device (S1). The switches 14, 15 are synchronised by timing generator 17, which may be synchronised by external synchronisation signal 18. Switches 14, 15 are then inverted, which places the filter to the second frequency F2, and storing the second level value in sample storage device (S2). Sample storage device values S1 and S2 are then compared in comparator 16. Accordingly, if S2 is greater than S1, then the comparator output is low, and the filter tuning voltage signal 19 is increased. Inversely, if S2 is less than S1, then the comparator output is low and the filter tuning voltage and frequency signal 19 are decreased.

Figure 6:
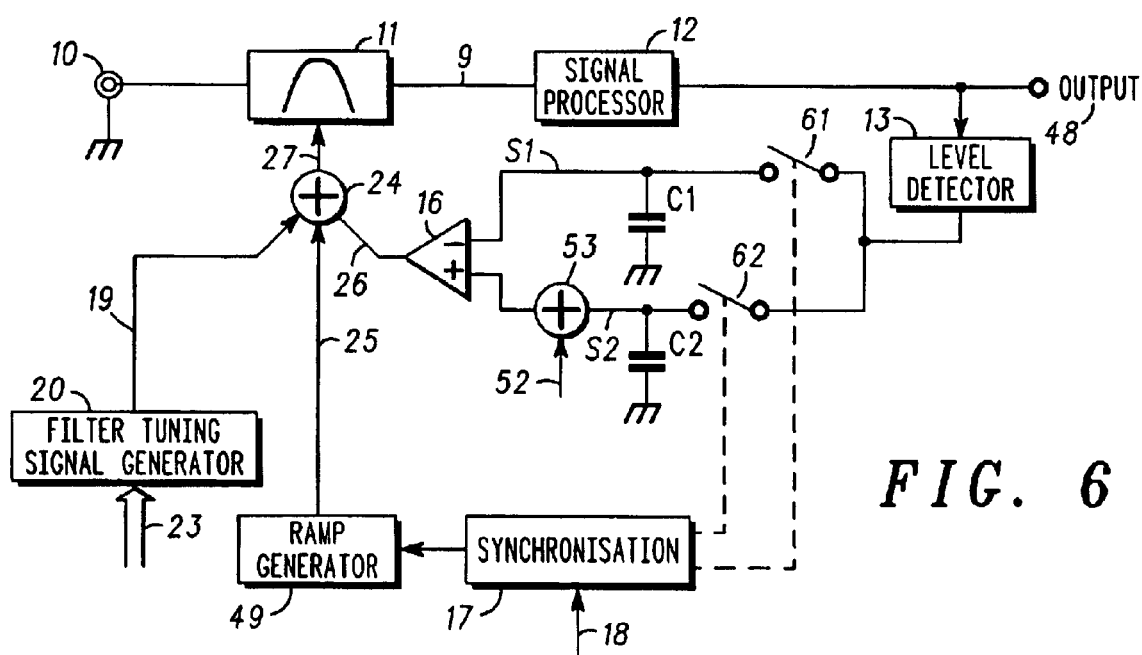
FIG. 6 shows a block diagram of the apparatus shown in FIG. 1 with frequency shift according to an embodiment of the invention.

One embodiment includes using analogue storage of the samples (S1, S2). For example, the sample storage values S1, S2 are stored in capacitors C1 and C2, as shown in FIG. 6, by closing at the appropriate instant corresponding with switches 61, 62, respectively. An amplifier 16 with differential inputs may be the comparator to compare the two sample storage values S1, S2, and applies a correction signal 26 to the filter tuning voltage signal 19.

Another embodiment includes using digital techniques and/or software associated with suitable interfaces such as analogue-to-digital and digital-to-analogue converters.

The switching action of the switches, for example switch 14 from F1 to F2, may disturb the signal at the output signal 28. Such a disturbance may be minimised by making the transition switch from F1 to F2 gradual. To minimise this disturbance, an alternating modulation signal may be added to the approximate filter tuning voltage. Any form of signal, for example a squarewave signal, a pulsed signal, a sine wave signal or a sawtooth signal may be used for the filter modulation signal to accomplish the transition from F1 to F2, however, a triangular waveform has proven to be easy to generate and does not introduce disagreeable jittering or jumping of the output signal. In the case of analogue TV application, the transition and sampling periods may be synchronised with the picture field frequency. In this manner, the sampling can take place during the vertical blanking period where disturbances to the picture will not be observed. Also, by making the transition period longer, for example by several field periods, the risk of disturbance to sound signal is reduced. As the drift of the filter with temperature is slow, for example causing a shift of several tens of kilohertz per second it is necessary, particularly in implementations using digital storage and/or software, to perform a correction cycle only periodically for example, once every second or every ten seconds. This further reduces the risk of disturbing the output signal 28. The sampling operation can be carried out at a time such as a programme change. It is the use of sample and hold techniques that allows the period of the filter sweep to be long, for example lasting several seconds.

Figure 3:
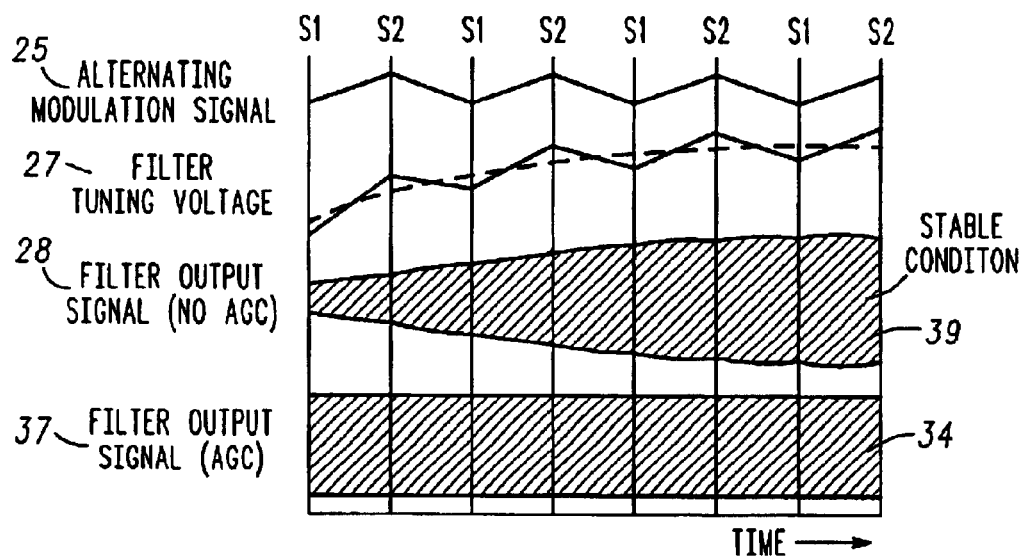
FIG. 3 shows a graph of signals within the system and spurious modulation of output signal of the apparatus shown in FIG. 1 according to an embodiment of the invention.
Figure 4:
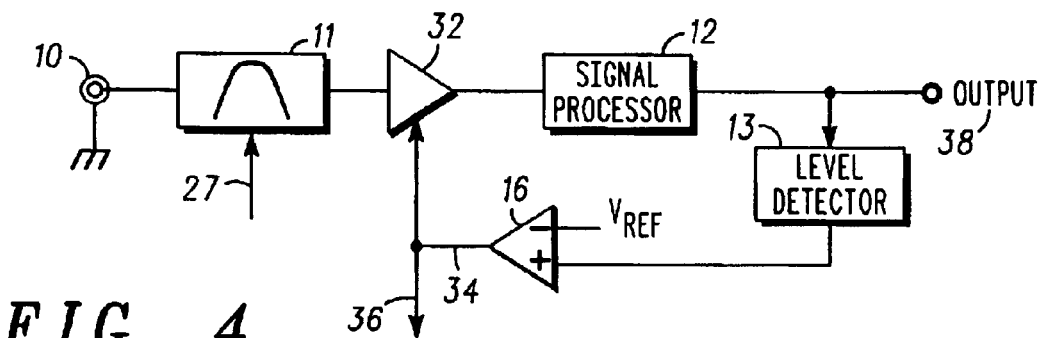
FIG. 4 shows a block diagram of a level detection from automatic gain control according to an embodiment of the invention.

Even with introducing a gradual transition at switch 14 between F1 and F2, there will still exist an additional amplitude modulation of the signal at the output of the filter signal 9, as shown in FIG. 3. The amount of amplitude modulation depends on the frequency deviation applied to the filter 11. By reducing the deviation, the amount of amplitude modulation added to the signal will be reduced, as well as the sensitivity and accuracy of the system. However, an automatic gain control (AGC), as shown in FIG. 4, may be provided with the signal processing 12. For example, a variable gain controlled amplifier 32 may be placed in the signal path, either in front of or behind the filter 11. In order to maintain the level of the output signal 28 constant, an error signal 34 is feedback from the output of the system with, for example level detector 13, and then applied to the variable gain amplifier 32, as shown in FIG. 4. Conveniently, the error signal 34 may be recognised as a measure of the signal level. Additionally, the AGC may be able to minimise the amplitude modulation caused by the shifting of the filter centre frequency by the tuning modulation signal. In this case the AGC circuitry, for example its time constants, must be designed to minimise the amplitude modulation modulation caused by the shifting of the filter centre frequency without causing distortion of the output signal.

Figure 5A:
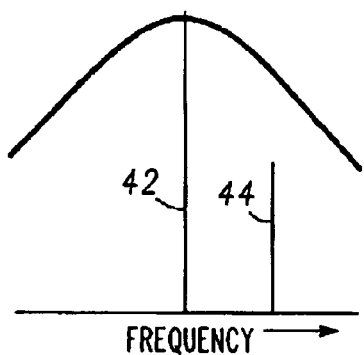
FIGS. 5a, 5b, 5c and 5d show graphs of the response of the apparatus shown in FIG. 1 in response to different types of signals according to an embodiment of the invention.
Figure 5B:
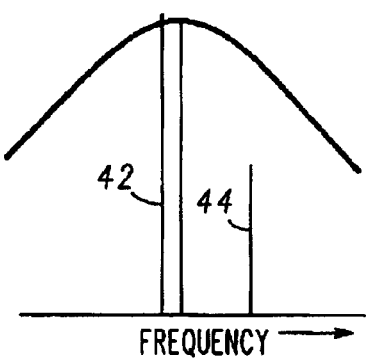
Figure 5C:
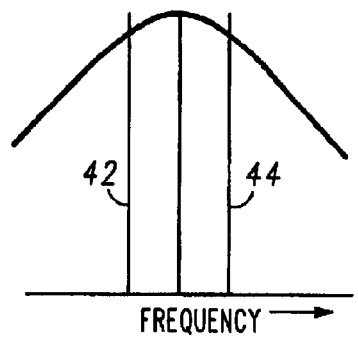
Figure 5D:
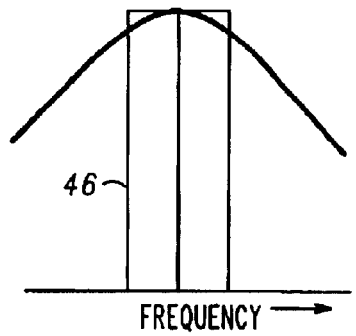

In many applications, such as filtering of a TV signal, the signal passed through the filter is not a simple carrier and the bandwidth of the signal may be slightly narrower than that of the filter. In these applications, therefore, accurate centring of the filter 11 is vital. An analogue TV signal consists of a picture carrier and a sound carrier. Typically, the power of the sound carrier is about a tenth of the picture carrier. The sound carrier may be for example 4.5, 5.5, 6.0 or 6.5 MHz higher in frequency than the picture carrier. If the level of the detector measures only the level of the picture carrier, the filter centre will be positioned on the picture carrier signal 42 as shown in FIG. 5a. However, if the total power is measured, taking into account both the picture carrier 42 and the sound carrier 44, the system will tend to centre the filter nearer the centre of the complete 45, as shown in FIG. 5b. Further correct centring alignment may be achieved when the picture carrier 42 and the sound carrier 44 have the same amplitude, as shown in FIG. 5c. In the case of a complex signal 46, for example a complex signal with a gaussian or rectangular spectrum, correct centring may be achieved if the total power of the signal is measured.

In another embodiment, a shift in the centring of the filter may be introduced into the system. For example one way to introduce a shift is by adding 53 a frequency offset 52 at the input of the comparator 16. By introducing the shift, the filter may be centred around an unsymmetrical signal, such as an analogue TV signal.

It will be appreciated that although the particular embodiments of the invention have been described above, various other modifications and improvements may be made by a person skilled in the art without departing from the scope of the present invention.

What is claimed is:

1. An apparatus for tuning a filter comprising:
   a filter for receiving an input signal and providing an output signal, the filter adapted to receive a tuning control signal to adjust the filter to provide the output signal to a desired signal, the tuning control signal resulting from a modulation signal, a correction signal and an approximate filter tuning signal generated by a filter tuning signal generator, the modulation signal having a frequency that varies between a first frequency and a second frequency, a first value of the output signal measured at the first frequency, and a second value of the output signal measured at the second frequency; and
   a comparator for computing the first value and the second value and providing the correction signal, to adjust the filter with the tuning control signal with respect to the first frequency and the second frequency of the modulation signal, the correction signal and the approximate filter tuning signal.

2. An apparatus as claimed in claim 1 wherein said modulation signal has a frequency that changes periodically between the first frequency and the second frequency.

3. An apparatus as claimed in claim 1 further comprising a switch to switch the frequency signals that generate the first and second frequencies of the modulation signal.

4. An apparatus as claimed in claim 1 wherein the change between the first frequency and the second frequency of the modulation signal is gradual.

5. An apparatus as claimed in claim 4 wherein the waveform of the alternating modulation signal is triangular.

6. An apparatus as claimed in claim 1 wherein the first value is stored in a first sample storage device and the second value is stored in a second sample storage device.

7. An apparatus as claimed in claim 6 wherein the sample storage devices are capacitors.

8. An apparatus as claimed in claim 6 wherein a sample switch is provided for switching to the correct sample storage device.

9. An apparatus as claimed in claim 8 wherein the sample switch and a modulation signal switch for switching the frequency signals that generate the first and second frequencies of the modulation signal, are synchronized with a picture field frequency of the input signal.

10. A method for tuning a filter:
    providing an input signal received at a filter to provide an output signal;
    adapting the filter to receive a tuning control signal, wherein the tuning control signal comprises a modulation signal alternating between a first frequency and a second frequency;
    providing an approximate filter tuning signal to the tuning control signal,
    measuring a first value of the output signal measured at the first frequency passing through the filter;
    measuring a second value or the output signal measured at the second frequency passing through the filter;
    comparing at a comparator the first value and the second value and providing a correction signal based on said comparing to a filter tuning control signal; and
    adjusting the filter with the tuning control signal with respect to the first frequency and the second frequency of the modulation signal, the correction signal and the approximate filter tuning signal.

* * * * *